(12) United States Patent
Sato

(10) Patent No.: US 6,556,066 B2
(45) Date of Patent: Apr. 29, 2003

(54) BOOSTING METHOD AND APPARATUS

(75) Inventor: Takahiko Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/853,779

(22) Filed: May 14, 2001

(65) Prior Publication Data

US 2001/0048338 A1 Dec. 6, 2001

(30) Foreign Application Priority Data

May 31, 2000 (JP) ......................................... 2000-162902

(51) Int. Cl.[7] ................................................. G05F 1/10
(52) U.S. Cl. ........................ 327/536; 327/390; 327/589
(58) Field of Search ................................. 327/536, 534, 327/390, 589, 590, 157, 148; 363/59, 60

(56) References Cited

U.S. PATENT DOCUMENTS 5,581,455 A * 12/1996 Rossi et al. ..................... 363/60
5,982,647 A * 11/1999 Martin et al. ................... 363/59

* cited by examiner

Primary Examiner—Tuan T. Lam
Assistant Examiner—Hiep Nguyen
(74) Attorney, Agent, or Firm—Arent Fox Kintner Plotkin & Kahn

(57) ABSTRACT

If single-stage boosting is selected by a mode selection circuit, drive signals (S1, S3) are supplied as in-phase signals, and a switch (SW1) is kept closed by a control signal (S2), thereby controlling first and second charge pumps to boost the power supply voltage at the same timing. If two-stage boosting is selected, drive signals (S1, S3) are supplied as complementary signals, and the switch (SW1) is controlled by a control signal (S2), thereby controlling the first charge pump to boost the power supply voltage and controlling the second charge pump to further boost the boosted voltage. By this operation, even if single-stage boosting is selected, the first and second charge pumps can be used as a single charge pump.

12 Claims, 7 Drawing Sheets

BOOSTING METHOD AND APPARATUS

CROSS-REFERENCE TO RELATED APPLICATIONS

This application is based upon and claims priority of Japanese Patent Application No. 2000-162902, filed on May 31, 2000, the contents being incorporated herein by reference.

BACKGROUND OF THE INVENTION

1. Field of the Invention

The present invention relates to boosting methods and apparatus, in particular, suitably used for semiconductor integrated circuits including circuits for boosting power supply voltages.

2. Description of the Related Art

Conventionally, in a device such as a semiconductor integrated circuit, when a voltage higher than an external power supply voltage is required, a boosting circuit such as a charge pump in the device is used to boost the external power supply voltage to the voltage required by the device. This boosted voltage depends on the level of the external power supply voltage. Therefore, if the external power supply voltage is slightly lower than the boosted voltage required by the device, the external power supply voltage is boosted twice by using one charge pump. If the boosted voltage required by the device cannot be obtained by two-fold boosting, the external power supply voltage is boosted by three times by using two charge pumps.

In designing a device using the voltage obtained by boosting an external power supply voltage with boosting circuits such as charge pumps, it is determined in the early designing stage whether the number of boosting stages is one or two.

However, if the device is designed after the number of boosting stages is determined in the early designing stage, an operation error may occur in the device after it is manufactured. Assume that the boosted voltage required by the device is almost equal to the voltage obtained by one-stage boosting. In this case, if the device is designed as a one-stage boosting circuit, the device sometimes does not operate due to a shortage of voltage. In such a case, the device must be redesigned from the beginning, which requires much labor.

In one method for solving this problem, two charge pumps are switched so that the two charge pumps are used when the boosted voltage to be used by a device is higher than an external power supply voltage, and only one charge pump is used when the boosted voltage is slightly higher than the power supply voltage. For example, according to the driving voltage supplying apparatus disclosed in Japanese Patent Application Laid-Open No. 6-78527, two charge pumps are set up in an integrated circuit. When only one stage of boosting is required, only one charge pump predetermined is operated while the other charge pump is not operated. When two stages of boosting are required, both the charge pumps are operated.

In this method in which two charge pumps are set up in a device and one or two charge pumps are selectively used, however, when the voltage required by the device can be obtained by only one stage of boosting, the other charge pump becomes a redundant circuit because it is not operated. Besides, since the pumping capacitor of each charge pump has a large circuit area, a problem arises in terms of a waste of a circuit area particularly in a high-density circuit such as an integrated circuit.

SUMMARY OF THE INVENTION

It is an object of the present invention to provide boosting methods and apparatus wherein the numbers of boosting stages can be changed even after being manufactured, without wasting any circuit area.

A boosting apparatus according to the present invention for boosting a power supply voltage, is characterized in that a plurality of cascade-connected boosting circuits are controlled to boost voltages at the same timing when a boosting mode signal output from a selection circuit indicates a first mode.

A boosting method according to the present invention using a boosting apparatus including a plurality of cascade-connected boosting circuits, is characterized in that the plurality of boosting circuits are controlled to boost voltages at the same timing in response to a boosting mode signal.

The present invention having the above construction includes a plurality of cascade-connected boosting circuits, and a control circuit controls the plurality of boosting circuits in accordance with a boosting mode signal output from a selection circuit. If the boosting mode signal output from the selection circuit indicates a first mode, the plurality of boosting circuits are controlled to boost power supply voltages at the same timing. This makes it possible to change the number of boosting stages. In addition, in the first mode, the plurality of boosting circuits operate concurrently as a single boosting circuit to boost the power supply voltage. Therefore, even if the boosting modes are switched, the plurality of boosting circuits can be effectively used without wasting any circuit area.

In addition, since the selection circuit for outputting a boosting mode signal is provided, the optimum number of boosting stages can be selected at an arbitrary point of time if a problem such as a shortage of voltage is detected not only before but even after the apparatus is manufactured.

DETAILED DESCRIPTION OF THE PREFERRED EMBODIMENTS

Hereinafter, embodiments of the present invention will be described with reference to the accompanying drawings.

Figure 1:
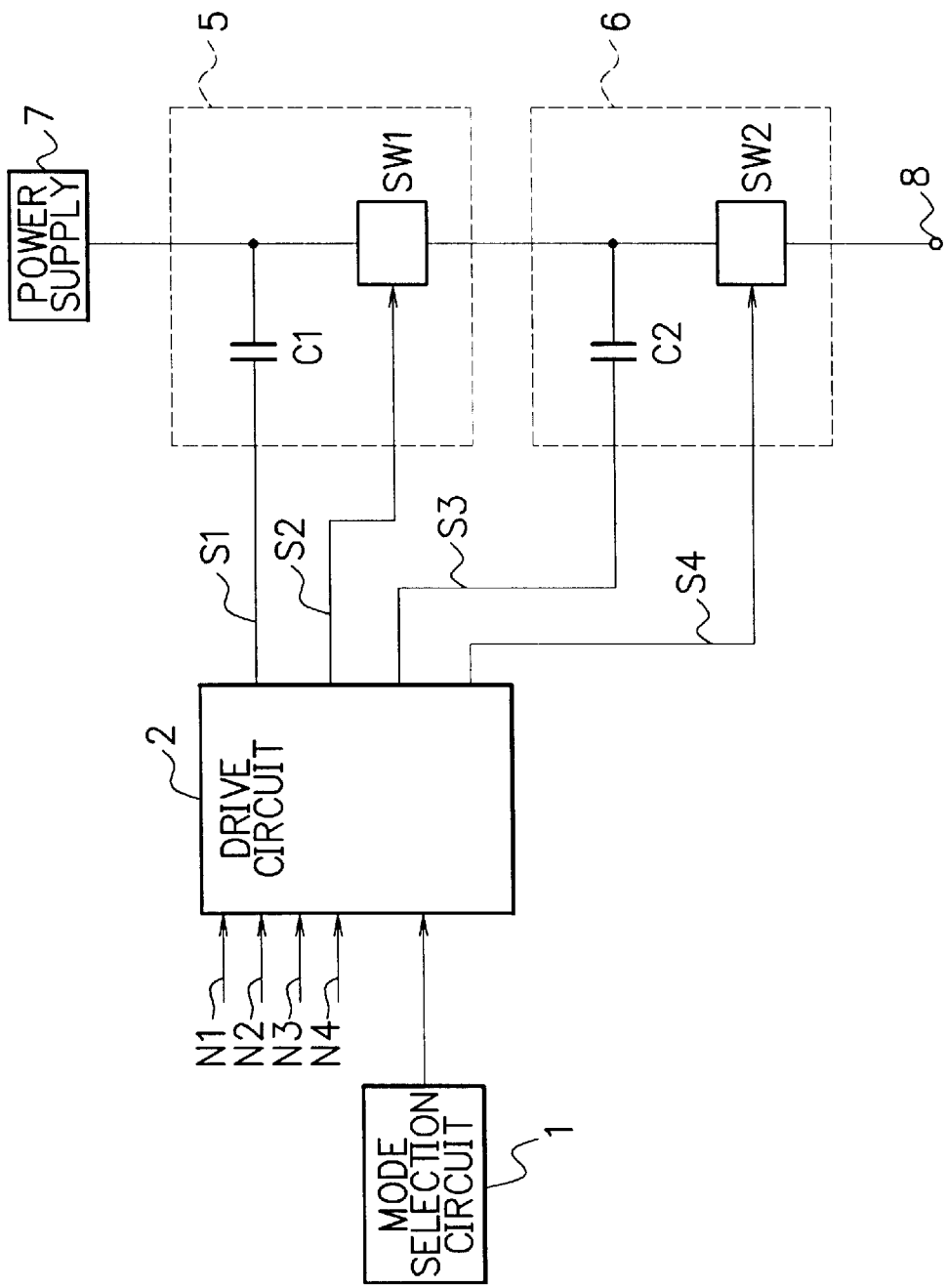
FIG. 1 is a block diagram showing an example of construction of a boosting apparatus according to the first embodiment of the present invention.

FIG. 1 is a block diagram showing an example of construction of a boosting apparatus according to the first embodiment of the present invention.

Referring to FIG. 1, a mode selection circuit 1 is for selecting the number of boosting stages (boosting factor) for a power supply voltage, and outputting a mode signal on the basis of the selected number of boosting stages. For example, the number of boosting stages is selected by selectively cutting off fuses or the like prepared in the mode selection circuit 1.

Alternatively, the mode selection circuit 1 may have an input terminal through which an external signal can be input, and the number of boosting stages may be selected with a signal input through the input terminal. The number of boosting stages may be selected by whether selectively cutting off fuses or not in the mode selection circuit 1.

A drive circuit 2 is for controlling first and second charge pumps 5 and 6 on the basis of a mode signal supplied from the mode selection circuit 1 and pump driving signals N1, N2, N3, and N4 externally supplied. More specifically, the drive circuit 2 generates drive signals S1 and S3 and control signals S2 and S4 on the basis of the mode signal supplied from the mode selection circuit 1 and the pump driving signals N1, N2, N3, and N4 externally supplied. The drive circuit 2 then outputs the drive signal S1 and the control signal S2 to the first charge pump 5, and outputs the drive signal S3 and the control signal S4 to the second charge pump 6, thereby controlling the charge pumps.

If one-stage boosting is selected by the mode selection circuit 1, the drive circuit 2 outputs the control signals S2 and S4 to charge the first and second charge pumps 5 and 6 with the voltage supplied from a power supply 7. The drive circuit 2 then outputs the drive signals S1 and S3 to boost the voltages charged in the first and second charge pumps 5 and 6. The drive circuit 2 outputs the control signals S2 and S4 to the first and second charge pumps 5 and 6 to supply the boosted voltages to an output node 8.

If two-stage boosting is selected by the mode selection circuit 1, the drive circuit 2 first outputs the control signal S2 to charge the first charge pump 5 with the voltage supplied from the power supply 7. The drive circuit 2 outputs the drive signal S1 to boost the voltage charged in the first charge pump 5.

The drive circuit 2 then outputs the control signals S2 and S4 to supply the boosted voltage from the first charge pump 5 to the second charge pump 6. In addition, the drive circuit 2 outputs the drive signal S3 to boost the voltage supplied from the first charge pump 5 and charged in the second charge pump 6. The drive circuit 2 outputs the control signal S4 to the second charge pump 6 to supply the voltage boosted by the second charge pump 6 to the output node 8.

The first charge pump 5 comprises a pumping capacitor C1 and a switch SW1. When two-stage boosting is selected by the mode selection circuit 1, the first charge pump 5 boosts, as the first-stage charge pump, the voltage supplied from the power supply 7, and outputs the resultant voltage to the second charge pump 6. When one-stage boosting is selected, the first charge pump 5 boosts, as a normal one-stage charge pump, the voltage supplied from the power supply 7, and outputs the resultant voltage to the output node 8 through the second charge pump 6.

The pumping capacitor C1 is charged with the voltage supplied from the power supply 7. The pumping capacitor C1 has two terminals. One terminal is connected to the drive circuit 2, through which terminal the drive signal S1 is input. The other terminal is connected to the power supply 7 and the switch SW1.

The switch SW1 operates to output selectively the output voltage from the pumping capacitor C1 or the power supply 7 to the second charge pump 6, and is made up from a transistor and the like. More specifically, the switch SW1 has three terminals. The first terminal is connected to the power supply 7 and the pumping capacitor C1. The second terminal is connected to the second charge pump 6. The third terminal is connected to the drive circuit 2 to receive the control signal S2. The switch SW1 performs ON/OFF operation between the first and second terminals in accordance with the control signal S2.

The second charge pump 6 comprises a pumping capacitor C2 and a switch SW2, like the first charge pump 5 as described above. When two-stage boosting is selected by the mode selection circuit 1, the second charge pump 6 boosts, as the second-stage charge pump, the voltage supplied from the first charge pump 5, and outputs the resultant voltage to the output node 8. When one-stage boosting is selected, the second charge pump 6 boosts, as a normal one-stage charge pump, the voltage from the power supply 7, and outputs the resultant voltage to the output node 8.

When one-stage boosting is selected by the mode selection circuit 1, the pumping capacitor C2 is charged with the voltage applied from the power supply 7 through the switch SW1. When two-stage boosting is selected, the pumping capacitor C2 is charged with the voltage applied from the pumping capacitor C1 through the switch SW1. The pumping capacitor C2 has two terminals. One terminal is connected to the drive circuit 2, through which terminal the drive signal S3 is input. The other terminal is connected to the first charge pump 5.

The switch SW2 operates to output selectively the voltage boosted by this boosting apparatus to the output node 8, and also serves to prevent a counter flow of charges from the output node 8 side to the charge pump side. The switch SW2 is made up from a transistor and the like. The switch SW2 has three terminals. The first terminal is connected to the first charge pump 5 and the pumping capacitor C2. The second terminal is connected to the output node 8. The third terminal is connected to the drive circuit 2 and receives the control signal S4. In accordance with this control signal S4, the switch SW2 performs ON/OFF operation between the first and second terminals.

The first and second charge pumps 5 and 6 are connected in series between the power supply 7 and the output node 8. The first charge pump 5 is connected to the power supply 7 side, and the second charge pump 6 is connected to the output node 8 side.

The power supply 7 supplies a power supply voltage to this boosting apparatus. The output node 8 is used to output the voltage boosted by the boosting apparatus to an internal circuit (e.g., a word line driving circuit for a dynamic memory).

The operation of this first embodiment will be described next with reference to FIGS. 2 and 3.

In this embodiment, the switches SW1 and SW2 are closed when the control signals S2 and S4 are set at "L", and opened when the signals are set at "H".

(One-stage Boosting)

Figure 2:
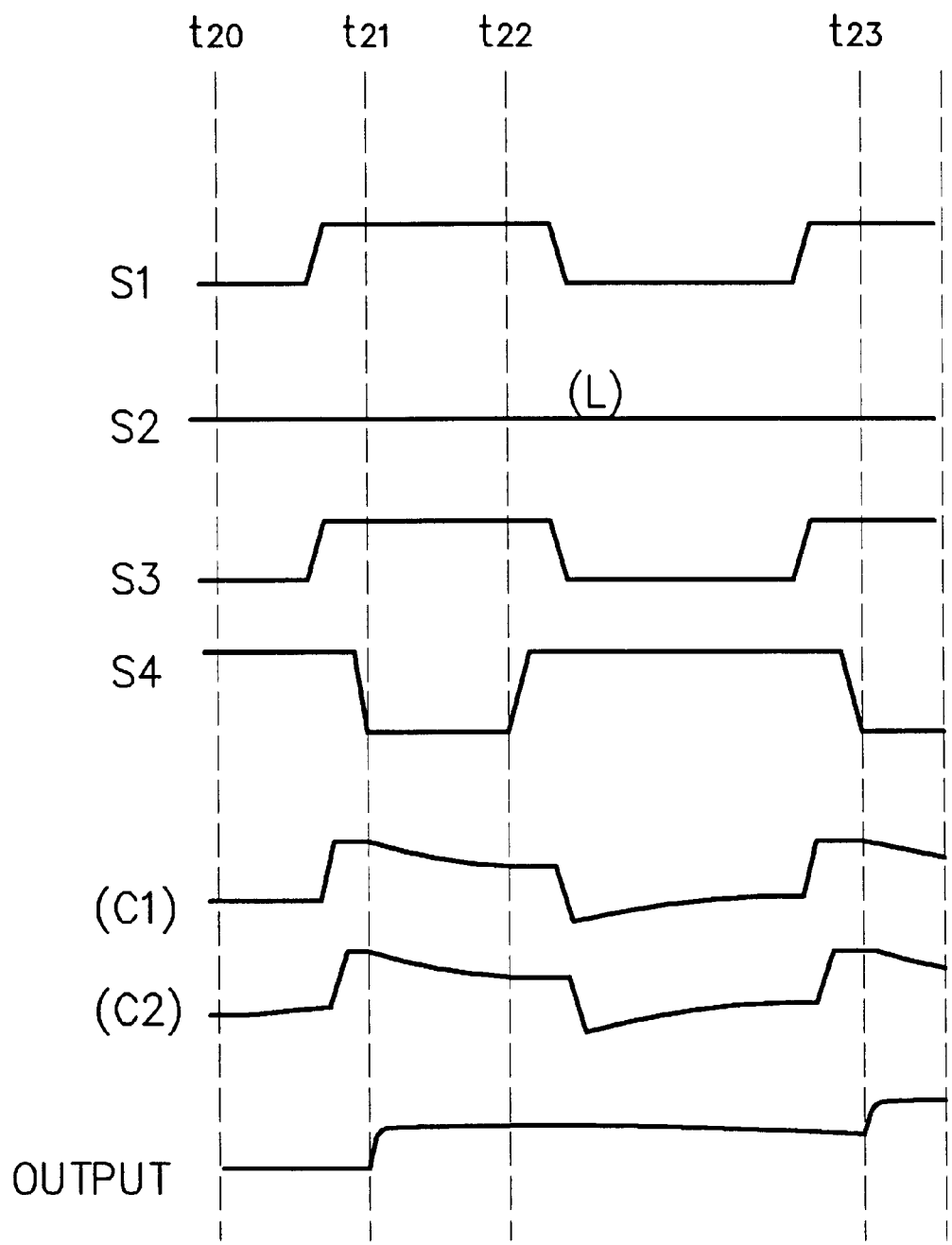
FIG. 2 is a timing chart for explaining a one-stage boosting operation in the boosting apparatus according to the first embodiment.

FIG. 2 is a chart for explaining a one-stage boosting operation in this first embodiment.

Referring to FIG. 2, as the drive signals S1 and S3, the pump driving signal N1 input as a pulse signal is output without any change. As the control signal S4, the pump driving signal N2 input as a pulse signal is output without any change. As the control signal S2, an "L"-level signal is always output regardless of the pump driving signals N1 to N4. That is, during the one-stage boosting operation, the switch SW1 is kept closed.

At time $t_{20}$, both the drive signals S1 and S3 are at "L", and the control signal S4 is at "H". At this time, the switch SW2 is open. That is, the pumping capacitors C1 and C2 are charged with the voltage applied from the power supply 7. When the pump driving signal N1 changes from "L" to "H", the drive signals S1 and S3 change from "L" to "H". As a result, the potentials at the switch sides of the pumping capacitors C1 and C2 rise.

At time $t_{21}$, the pump driving signal N2 changes from "H" to "L". As a result, the control signal S4 changes from "H" to "L". The switch SW2 is closed by this control signal S4, and the potential boosted by the pumping capacitors C1 and C2 is output from the output node 8.

At time $t_{22}$, as the pump driving signal N2 changes to "H", the control signal S4 is set at "H". The switch SW2 is then opened. By this operation, the potential boosted by the pumping capacitors C1 and C2 are stopped being applied to the output node 8, and the pumping capacitors C1 and C2 are charged with the voltage applied from the power supply 7 again. As the pump driving signal N1 changes to "L", the drive signals S1 and S3 are set at "L", and the potentials at the switch sides of the pumping capacitors C1 and C2 are lowered.

While the control signal S4 is at "H", the pumping capacitors C1 and C2 are charged with the voltage applied from the power supply 7, and then perform boosting operations in accordance with the drive signals S1 and S3. At time $t_{23}$, as the pump driving signal N2 changes, the control signal S4 is set at "L". As a result, the potential boosted by the pumping capacitors C1 and C2 is output through the output node 8.

(Two-stage Boosting)

Figure 3:
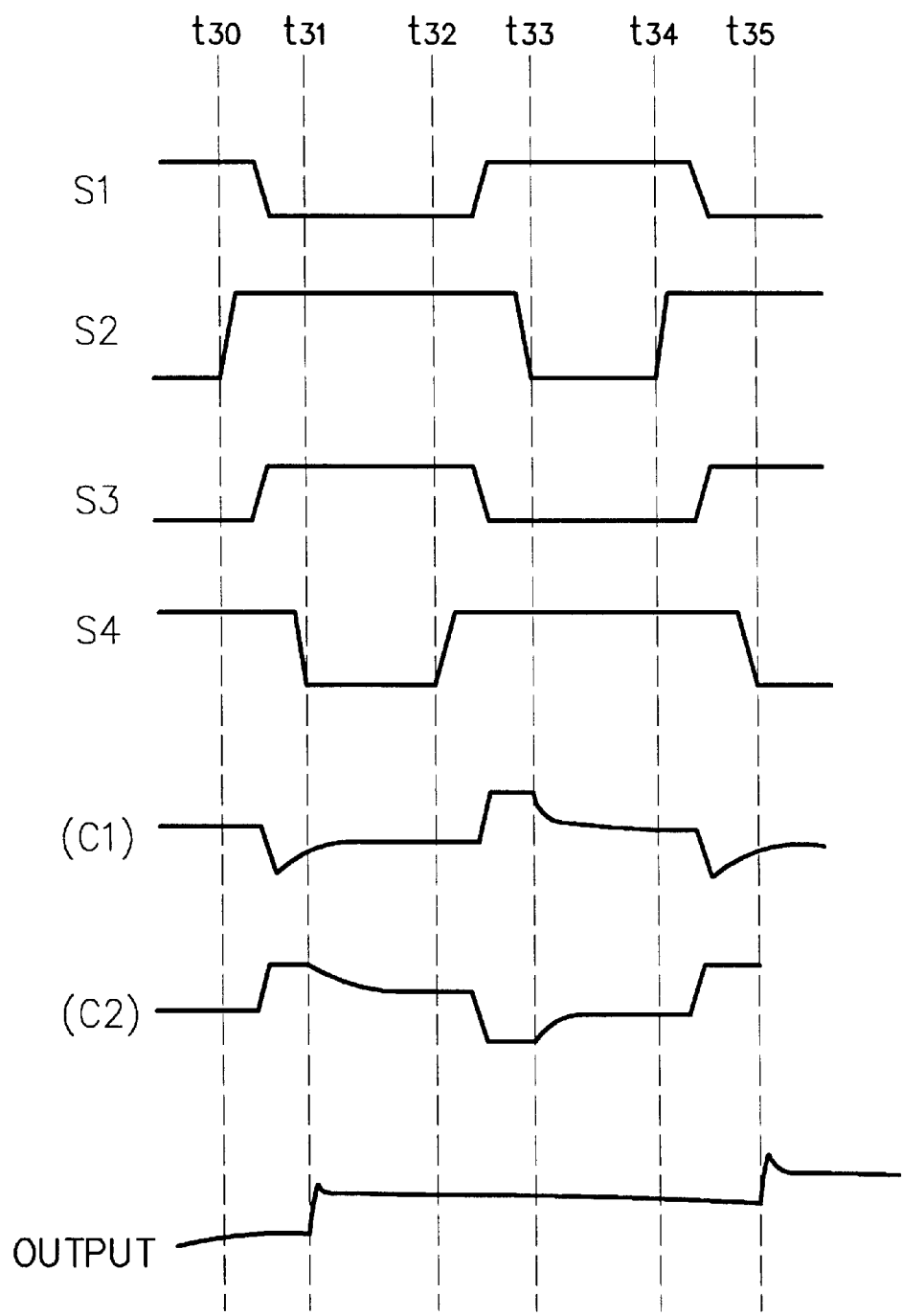
FIG. 3 is a timing chart for explaining a two-stage boosting operation in the boosting apparatus according to the first embodiment.

FIG. 3 is a chart for explaining a two-stage boosting operation in this first embodiment.

Referring to FIG. 3, as the drive signal S1, the pump driving signal N4 is output without any change. As the drive signal S3, the pump driving signal N1 is output without any change. As the control signal S2, the pump driving signal N3 is output without any change. As the control signal S4, the pump driving signal N2 is output without any change. The pump driving signals N1 and N4 are synchronous signals having different polarities. The pump driving signals N1 to N4 are input as pulse signals.

At time $t_{30}$, as the pump driving signal N3 changes from "L" to "H", the control signal S2 changes from "L" to "H". The switch SW1 is then opened. As a result, the pumping capacitor C1 is charged with the voltage applied from the power supply 7. At this time, the control signal S4 is at "H", and the switch SW2 is open. That is, the pumping capacitor C2 holds the charged voltage.

At time $t_{31}$, as the pump driving signal N2 changes from "H" to "L", the control signal S4 changes from "H" to "L". As the switch SW2 is closed with this control signal S4, the potential obtained by charging the pumping capacitor C2 before time $t_{30}$ and then being boosted by the pumping capacitor C2 is output to the output node 8.

Next, as the pump driving signal N4 changes from "L" to "H", the drive signal S1 changes from "L" to "H". The potential on the switch side of the pumping capacitor C1 then rises. In addition, as the pump driving signal N1 changes from "H" to "L", the drive signal S3 changes from "H" to "L". The potential on the switch side of the pumping capacitor C2 is then lowered.

At time $t_{33}$, as the pump driving signal N3 changes from "H" to "L", the control signal S2 changes from "H" to "L". The switch SW1 is closed with this control signal S2. The pumping capacitor C1 then supplies the boosted potential to the pumping capacitor C2.

At time $t_{34}$, as the pump driving signal N3 changes from "L" to "H", the control signal S2 changes from "L" to "H". The switch SW1 is then opened. By this operation, the pumping capacitor C1 is charged with the voltage supplied from the power supply 7 again, and the pumping capacitor C2 holds the charged voltage. While the control signal S4 is at "H", the pumping capacitor C2 keeps holding the charged voltage.

Further, as the pump driving signal N4 changes from "H" to "L", the pump driving signal N1 changes from "L" to "H". The drive signal S1 then changes from "H" to "L", and the drive signal S3 changes from "L" to "H". With these changes in the drive signals S1 and S3, the potential on the switch side of the pumping capacitor C1 is lowered, and the potential on the switch side of the pumping capacitor C2 rises.

At time $t_{35}$, as the pump driving signal N2 changes, the control signal S4 is set at "L". The switch SW2 is then closed. As a result, the potential boosted by the pumping capacitor C2 is output through the output node 8.

As described above, in the two-stage boosting operation, during the charging operation of the first charge pump 5, the second charge pump 6 performs its boosting operation. Next, during the boosting operation of the first charge pump 5, the second charge pump 6 performs its charging operation. This series of operations is repeated. When the boosting operation of the first charge pump 5 has completed, the switch SW1 is closed, and the second charge pump 6 is charged with the output of the first charge pump 5. Further, when the boosting operation of the second charge pump 6 has completed, the switch SW2 is closed, and the boosted output of the second charge pump 6 is supplied to the output node 8. That is, the potential boosted by the pumping capacitor C1 in the first charge pump 5 is supplied to the pumping capacitor C2 in the second charge pump 6. In addition, after the voltage is boosted by the pumping capacitor C2, the boosted voltage is supplied to an external circuit connected through the output node 8, thereby realizing three times boosting the voltage supplied from the power supply 7.

In addition, in the above two-stage boosting operation, to prevent a countercurrent, control is performed to close one of the switches SW1 and SW2 after they are opened.

As described above in detail, this embodiment includes the first and second charge pumps 5 and 6. When one-stage boosting is selected by the mode selection circuit 1, control is performed to make both the first and second charge pumps 5 and 6 boost the voltage supplied from the power supply 7. When two-stage boosting is selected, control is performed to make the first charge pump 5 boost the voltage supplied from the power supply 7 and then to make the second charge pump 6 further boost the voltage supplied from the first charge pump 5.

By this operation, when one-stage boosting is selected, the first and second charge pumps 5 and 6 can be used as a single charge pump. On the other hand, when two-stage boosting is selected, they can be used as separate charge pumps at two successive stages. Therefore, even when one-stage boosting is selected, any charge pump does not become a redundant circuit. This makes it possible to use the circuit area effectively. In addition, since the first and second charge pumps 5 and 6 are used in one-stage boosting, the ability to supply a current to the output node 8 is improved. This makes it possible to supply a stable current, in particular, even if the power supply voltage is low.

Besides, the provision of the mode selection circuit 1 for selecting one-stage boosting or two-stage boosting brings about easy selection of the number of boosting stages at an arbitrary point of time even if a problem such as a shortage of voltage is found after the apparatus is manufactured.

In this embodiment, the pump driving signals N1 and N4 externally input are used to generate the synchronous drive signals S1 and S3 having different polarities. However, the drive circuit 2 may generate the synchronous drive signals S1 and S3 having different polarities by using one of the pump driving signals N1 and N4.

The second embodiment of the present invention will be described next.

Figure 4:
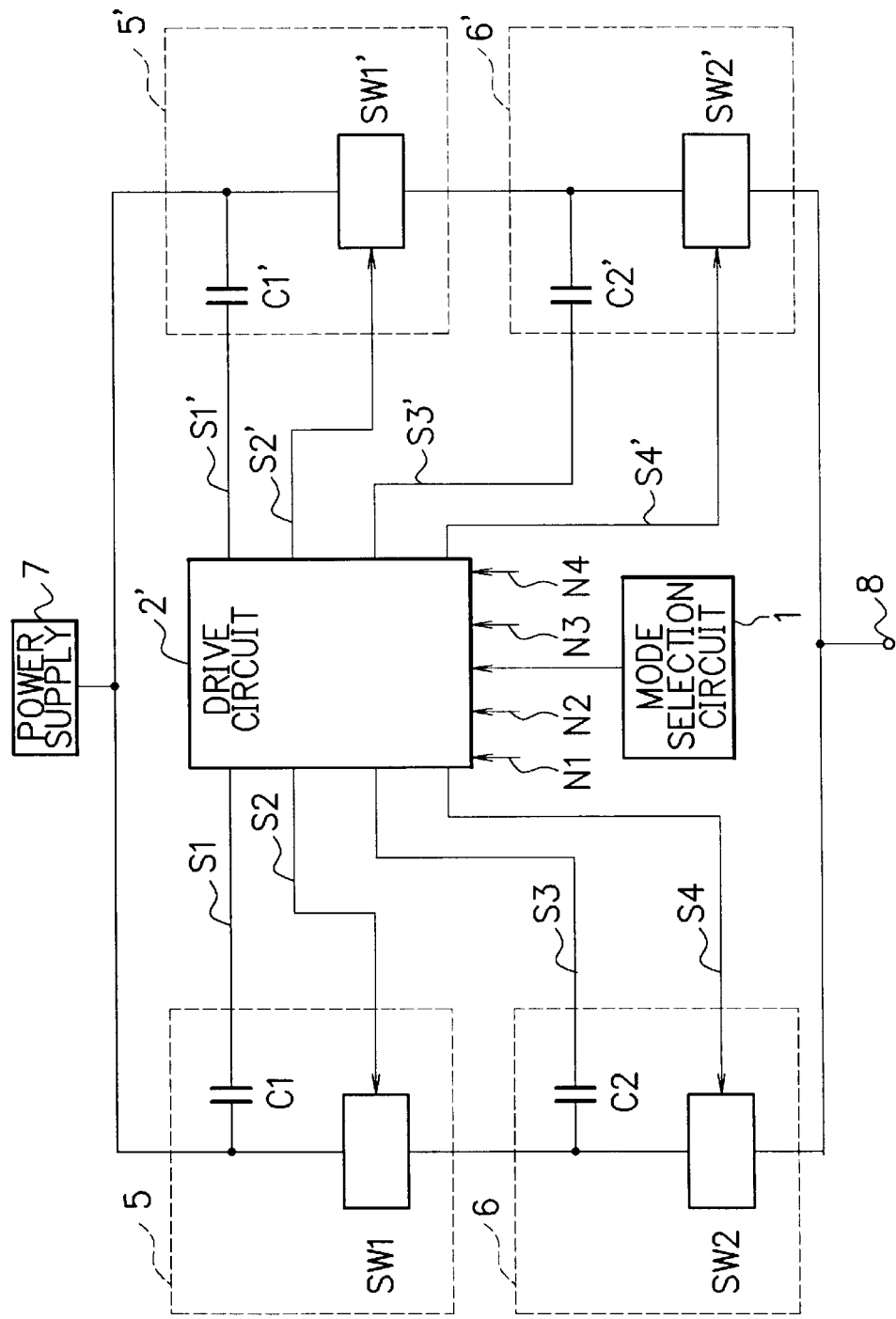
FIG. 4 is a block diagram showing an example of construction of a boosting apparatus according to the second embodiment of the present invention.

FIG. 4 is a block diagram showing an example of construction of a boosting apparatus according to the second embodiment.

In FIG. 4, the same reference numerals as in FIG. 1 denote the same parts as in FIG. 1, and the description thereof will be omitted. Besides, reference numerals with "'" denote blocks that are not identical to the corresponding blocks in FIG. 1 but have the same functions as those of the corresponding blocks.

The second embodiment shown in FIG. 4 uses two boosting apparatus each identical to the apparatus of the first embodiment. In this second embodiment, the timing for supplying the boosted power supply voltage from each boosting apparatus is controlled to boost the power supply voltage efficiently.

Referring to FIG. 4, a drive circuit 2' generates drive signals S1, S3, S1', and S3' and control signals S2, S4, S2', and S4' on the basis of a mode signal supplied from a mode selection circuit 1 and pump driving signals N1, N2, N3, and N4 externally supplied, and outputs the generated signals to control first, second, third, and fourth charge pumps 5, 6, 5', and 6'.

The drive signals S1, S3, S1', and S3' are input to pumping capacitors C1, C2, C1', and C2', respectively, to boost the voltages charged in the pumping capacitors C1, C2, C1', and C2'. The control signals S2, S4, S2', and S4' are input to switches SW1, SW2, SW1', and SW2' to control the switching operations of the respective switches.

The operation of this second embodiment will be described next with reference to FIGS. 5 and 6.

In the description of the operation, for the sake of descriptive convenience, the boosting apparatus made up from the first and second charge pumps 5 and 6 will be referred to as a first boosting apparatus, and the boosting apparatus made up from the third and fourth charge pumps 5' and 6' will be referred to as a second boosting apparatus.

In this second embodiment, like the first embodiment, assume that the switches SW1, SW2, SW1', and SW2' are closed when the control signals S2, S4, S2', and S4' are at "L", and opened when they are at (One-stage Boosting)

Figure 5:
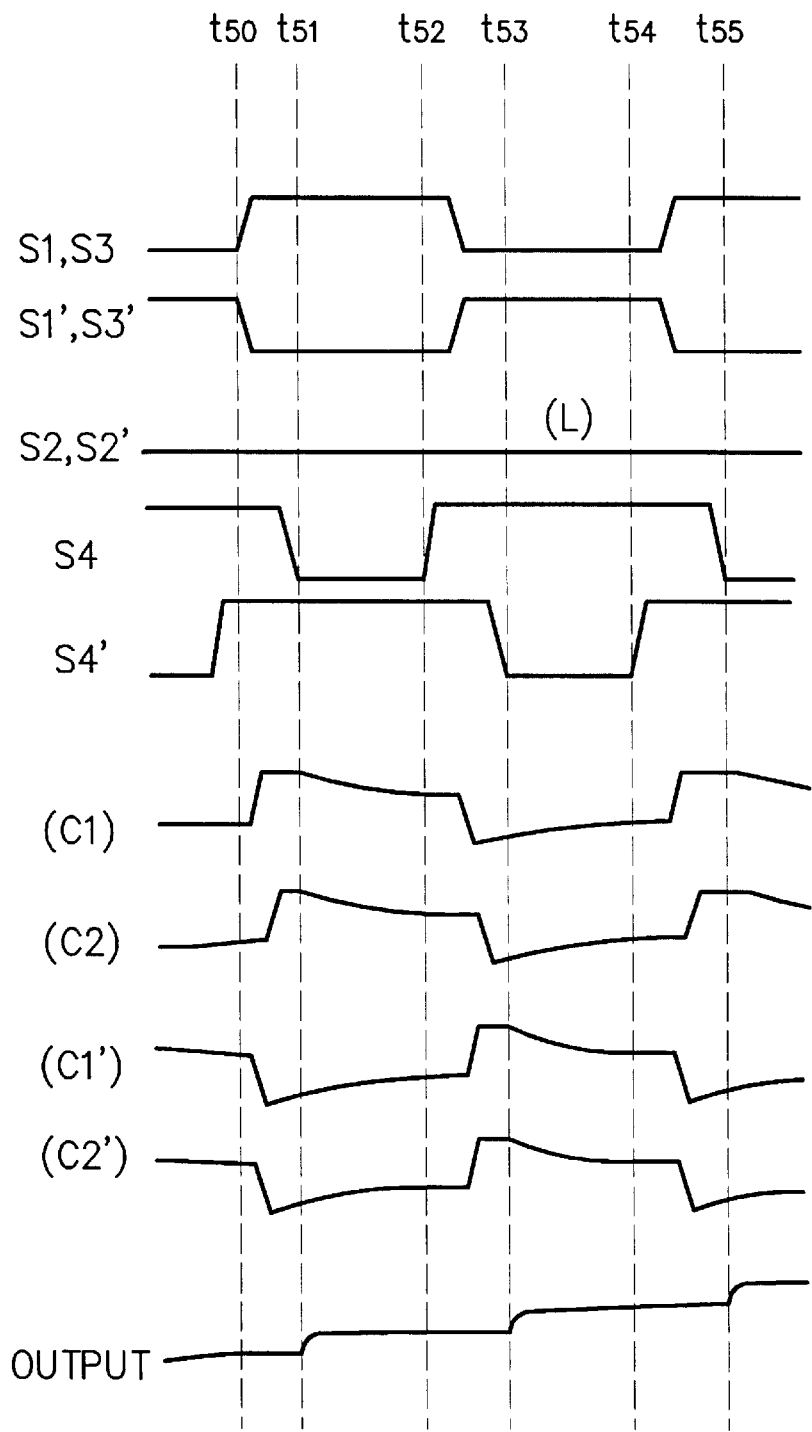
FIG. 5 is a timing chart for explaining a one-stage boosting operation in the boosting apparatus according to the second embodiment.

FIG. 5 is a chart for explaining a one-stage boosting operation in this second embodiment.

Referring to FIG. 5, as the drive signals S1 and S3, the pump driving signal N1 is output without any change. As the drive signals S1' and S3', the pump driving signal N4 is output without any change. As the control signal S4, the pump driving signal N2 is output without any change. As the control signal S4', the pump driving signal N3 is output without any change. As the control signals S2 and S2', "L"-level signals are always output regardless of the pump driving signals N1 to N4. That is, in this one-stage boosting operation, the switches SW1 and SW11 are always closed.

The pump driving signals N1 to N4 are input as pulse signals.

As shown in FIG. 5, since the one-stage boosting operation for a power supply 7 in the first and second boosting apparatus is the same as that in the boosting apparatus shown in FIG. 1, the description of the one-stage boosting operation in each boosting apparatus will be omitted, and the operation for supplying the boosted potential by the first and second boosting apparatus to an output node 8 will be described.

At time $t_{50}$, both the control signals S4 and S4' are at "H", and both the second and fourth switches SW2 and SW2' are open. In this state, the potential boosted by the first or second boosting apparatus is not output through the output node 8.

At time $t_{51}$, as the control signal S4 changes from "H" to "L", the second switch SW2 of the first boosting apparatus is kept closed until time $t_{52}$ at which the control signal S4 is set at "H" again. When the second switch SW2 is closed, the potential boosted by the first boosting apparatus is output through the output node 8. At time $t_{52}$, the control signal S4 is set at "H" to open the switch SW2. This prevents the potential boosted by the first or second boosting apparatus from being output through the output node 8.

At time $t_{53}$, as the control signal S4' changes from "H" to "L", the fourth switch SW2' is kept closed until time $t_{54}$ at which the control signal S4' is set at "H" again. By this operation, the potential boosted by the second boosting apparatus is output through the output node 8. At time $t_{54}$, the control signal S4' is set at "H" to open the switch SW2'. This prevents the potential boosted by the first or second boosting apparatus from being output through the output node 8.

In this manner, the control signals S4 and S4' i.e., the pump driving signals N2 and N3, are controlled to output alternately the power supply voltages boosted by the first and second boosting apparatus through the output node 8, thereby boosting the power supply voltage.

(Two-stage Boosting)

Figure 6:
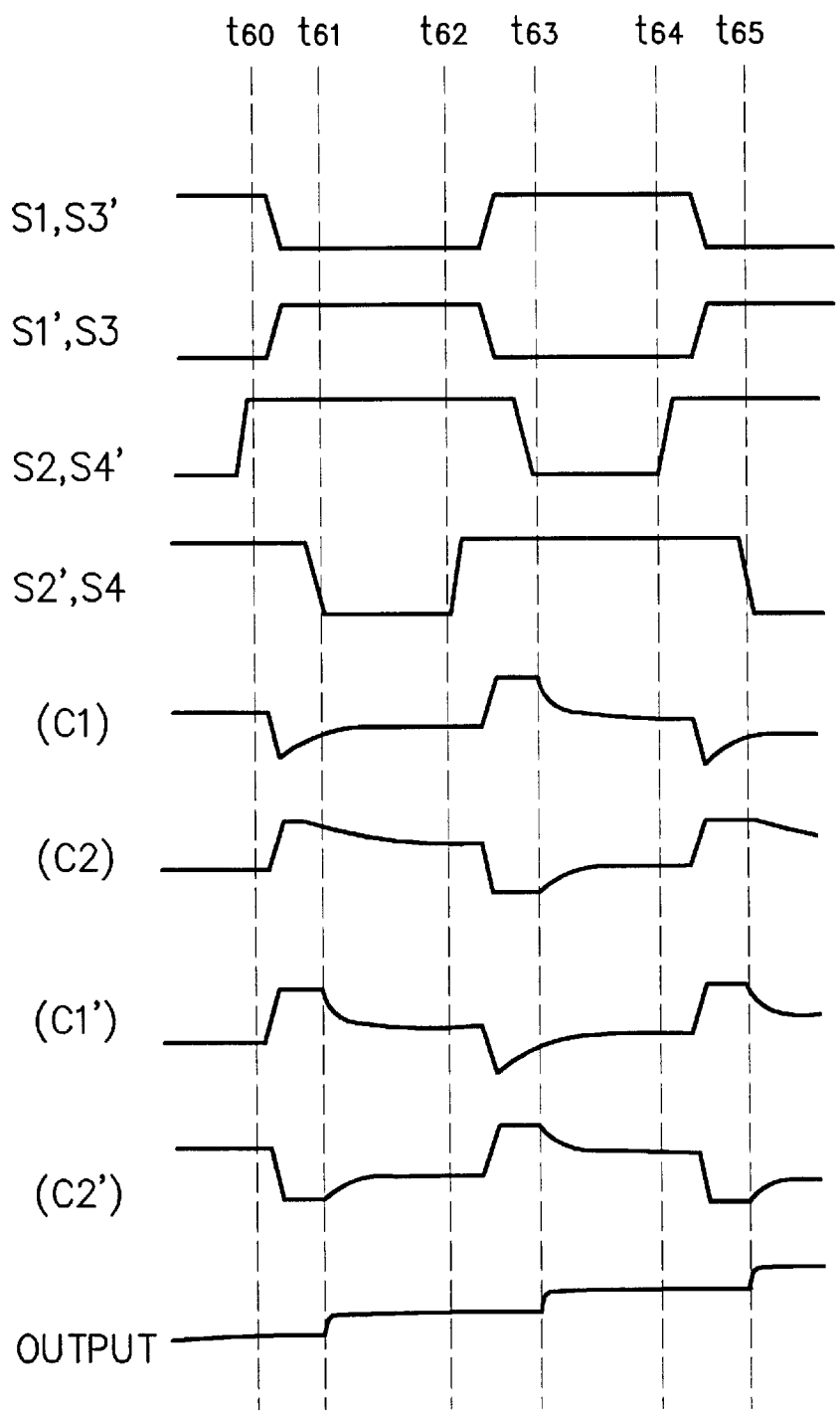
FIG. 6 is a timing chart for explaining a two-stage boosting operation in the boosting apparatus according to the second embodiment.

FIG. 6 is a chart for explaining a two-stage boosting operation in this second embodiment.

Referring to FIG. 6, as the drive signals S3 and S1', the pump driving signal N1 is output without any change. As the drive signals S1 and S3', the pump driving signal N4 is output without any change. As the control signals S4 and S2', the pump driving signal N2 is output without any change. As the control signals S2 and S4', the pump driving signal N3 is output without any change.

The pump driving signals N1 to N4 are input as pulse signals.

As shown in FIG. 6, since the two-stage boosting operation for the power supply 7 in the first and second boosting apparatus is the same as that in the boosting apparatus shown in FIG. 1, the description will be omitted, and the operation for supplying the boosted potential by the first and second boosting apparatus to the output node 8 will be described.

At time $t_{60}$, both the control signals S4 and S4' are at "H", and both the second and fourth switches SW2 and SW2' are open. In this state, the potential boosted by the first or second boosting apparatus is not output through the output node 8.

At time $t_{61}$, as the control signals S4 and S2' change from "H" to "L", the second and third switches SW2 and SW1' are kept closed until time $t_{62}$ at which the control signals S4 and S2' are set at "H" again. During this period, the first boosting apparatus outputs the boosted potential through the output node 8. Meanwhile, the second boosting apparatus performs a second-stage boosting operation. At time $t_{62}$, the control signals S4 and S2' are set at "H" to open the second and third switches SW2 and SW1'. This prevents the potential boosted by the first or second boosting apparatus from being output through the output node 8.

At time $t_{63}$, as the control signals S2 and S4' change from "H" to "L", the first and fourth switches SW1 and SW2' are kept closed until time $t_{64}$ at which the control signals S2 and S4' are set at "H" again. During this operation, the first boosting apparatus performs a second-stage boosting operation, and the second boosting apparatus outputs the boosted potential through the output node 8. At time $t_{64}$, as the control signals S2 and S4' are set at "H", the first and fourth switches SW1 and SW2' are opened. This prevents the potential boosted by the first or second boosting apparatus from being output through the output node 8.

In this manner, the power supply voltages boosted by the first and second boosting apparatus are alternately output through the output node 8. The boosting apparatus that dose not output its boosted voltage through the output node 8 then performs second-stage boosting for the power supply voltage. The power supply voltage is boosted by controlling the control signals S2, S4, S2', and S4' i.e., the pump driving signals N2 and N3, so as to perform the above-described operation.

The circuit construction of the boosting apparatus according to this second embodiment will be described with reference to FIG. 7.

Figure 7:
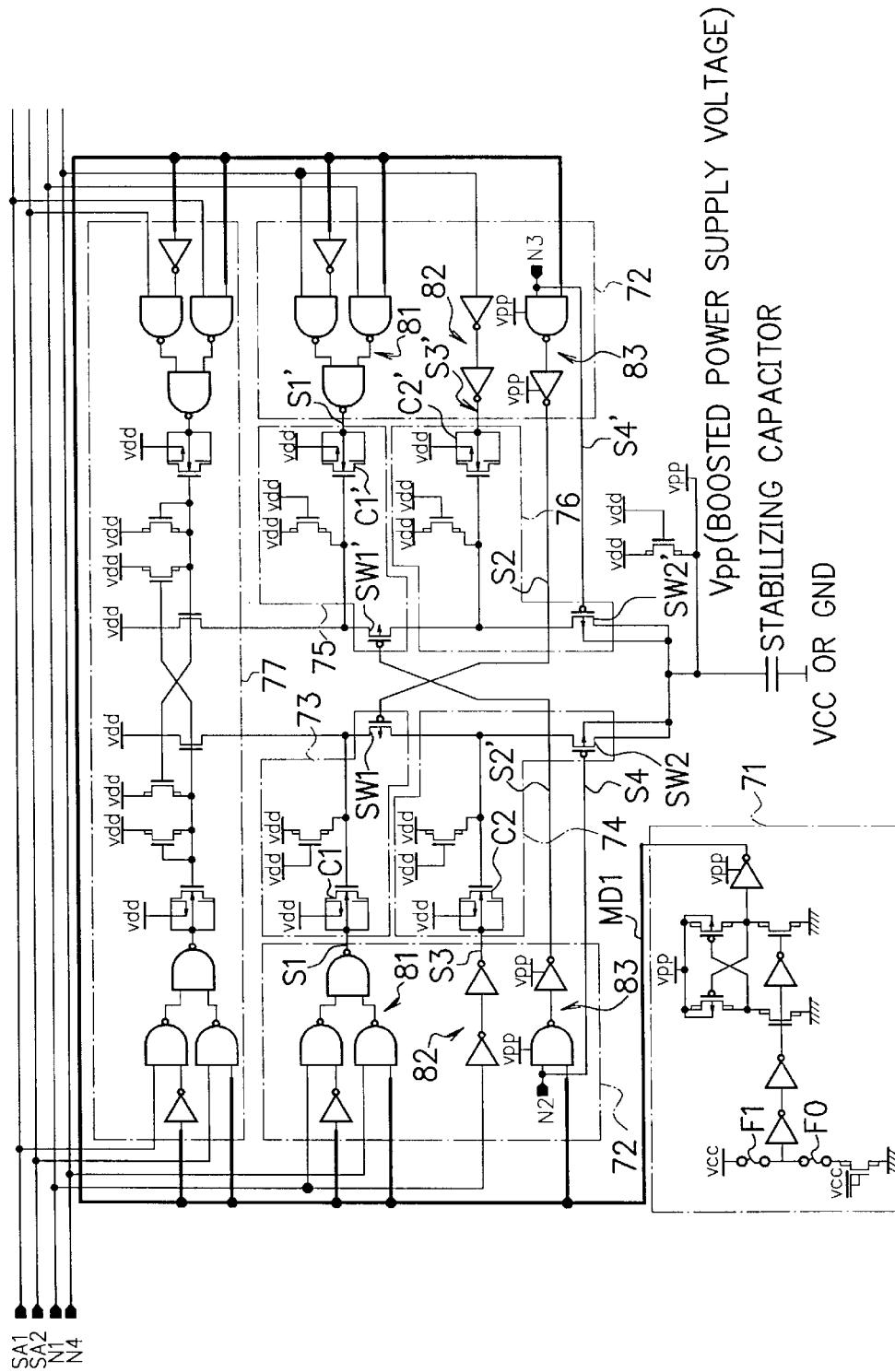
FIG. 7 is a circuit diagram showing the detail of each functional section in the boosting apparatus according to the second embodiment.

FIG. 7 is a circuit diagram showing in detail the functional components of the boosting apparatus according to the second embodiment.

Referring to FIG. 7, a mode selection circuit 71 is made up from four inverters, five transistors, and two fuses F0 and F1. The two fuses F0 and F1 are connected in series between a power supply VCC and the ground, and the inverters and the transistors are connected to a node between the fuses. Therefore, by cutting off one of the fuses F0 and F1, an "H"- or "L"-level signal can be output as a mode signal MD1.

For selecting one-stage boosting, the fuse F0 is cut off to input an "H"-level signal to the first-stage inverter, and output the mode selection signal MD1 at "L"-level from the mode selection circuit 71. For selecting two-stage boosting, the fuse F1 is cut off to input an "L"-level signal to the first-stage inverter, and output the mode selection signal MD1 at "H"-level from the mode selection circuit 71.

A drive circuit 72 includes a circuit 81 made up from one inverter and three NAND circuits for generating the drive signal S1 (S1'). The mode selection signal MD1 and the pump driving signals N1 and N4 are input to the circuit 81 for generating the drive signal S1 (S1').

The mode selection signal MD1 is input to the inverters. Of the three NAND circuits, two NAND circuits constitute an input stage. One NAND circuit receives, as its input, the mode selection signal MD1 inverted by the inverter and the pump driving signal N1 (N4). The other NAND circuit receives, as its input, the mode selection signal MD1 and the pump driving signal N4 (N1).

The remaining one NAND circuit forms an output stage, to which outputs of the two NAND circuits of the input stage are input. The NAND operation result of the output stage is then output as the drive signal S1 (S1').

When the mode selection circuit 71 selects one-stage boosting and outputs the "L"-level mode selection signal MD1, the pump driving signal N1 (N4) is selected and output as the drive signal S1 (S1'). When the mode selection circuit 71 selects two-stage boosting and outputs the "H"-level mode selection signal MD1, the pump driving signal N4 (N1') is selected and output as the drive signal S1 (S1').

A circuit 82 for generating the drive signal S3 (S3') is made up from two inverters connected in series. The circuit 82 for generating the drive signal S3 (S3') receives, as its input, the pump driving signal N1 (N4), and outputs it as the drive signal S3 (S3').

A circuit 83 for generating the control signal S2 (S2') is made up from one NAND circuit and one inverter connected in series. The mode selection signal MD1 and the pump driving signal N3 (N2) are input to the NAND circuit. The operation result obtained by this circuit is input to the inverter. The inverter then inverts the input signal and outputs the resultant signal as the control signal S2 (S2').

When the mode selection circuit 71 selects one-stage boosting and outputs the "L"-level mode selection signal MD1, an "L"-level signal is output as the control signal S2 (S2') regardless of the pump driving signal N3 (N2). When the mode selection circuit 71 selects two-stage boosting and outputs the "H"-level mode selection signal MD1, the pump driving signal N3 (N2) is selected and output as the control signal S2 (S2')

As a signal line for the control signal S4 (S4'), a signal line for the pump driving signal N2 (N3) is wired.

In the apparatus provided are a first charge pump 73, a second charge pump 74, a third charge pump 75, and a fourth charge pump 76. The first to fourth charge pumps 73 to 76 are each made up from two transistors (including SW1, SW2, SW1', or SW2') and one capacitor C1, C2, C1', or C2'.

A circuit 77 is for supplying charges to the charge pumps 73 to 76 to operate them, and restoring a boosted voltage to its original level. This circuit is made up from six transistors, two capacitors, six NAND circuits, and two inverters.

As described above, according to this second embodiment, the two boosting apparatus each identical to the apparatus of the first embodiment are connected in parallel with the drive circuit 2' and designed to boost alternately the power supply voltage. This prevents the second charge pump from becoming a redundant circuit and makes it possible to use the circuit area effectively. In addition, as the voltage output through the output node 8, the power supply voltage can be efficiently boosted in a short period of time in comparison with the first embodiment. This makes it possible to cope with an external circuit that operates at a high clock rate. In addition, the use of the first and second charge pumps in the one-stage boosting operation improves the current supplying ability. This makes it possible to supply a stable current, in particular, even if the power supply voltage is low.

Furthermore, the provision of the mode selection circuit 1 for selecting one-stage boosting or two-stage boosting enables easy selection of the number of boosting stages at an arbitrary point of time even if a problem such as a shortage of voltage is found after the apparatus is manufactured.

In this embodiment, the synchronous drive signals S1, S3, S1', and S3' having different polarities are generated by using the externally input pump driving signals N1 and N4. However, the drive circuit 2 may generate the synchronous drive signals S1, S3, S1', and S3' having different polarities by using one of the pump driving signals N1 and N4.

In the first and second embodiments, the two charge pumps are connected in series between the power supply 7 and the output node 8 to implement the boosting apparatus for performing one-stage boosting or two-stage boosting for the power supply voltage. However, three or more charge pumps may be connected in series between the power supply 7 and the output node 8, and terminals for arbitrarily taking out the outputs of the charge pumps may be provided so that the mode selection circuit 1 can select an arbitrary number of boosting stages as a second mode.

What is claimed is:

1. A boosting apparatus for boosting a power supply voltage and outputting a boost voltage, said apparatus comprising:
    cascade-connected first and second boosting circuits;
    a selection circuit for outputting a boosting mode signal; and a control circuit for controlling said first and second boosting circuits in accordance with said boosting mode signal, wherein said control circuit controls said first and second boosting circuits at the same phase to boost power supply voltages by a one-stage boosting when said boosting mode signal indicates a first mode, and controls said first and second boosting circuits at different phases to boost power supply voltages by a two-stage boosting when said boosting mode signal indicates a second mode.

2. The apparatus according to claim 1, wherein
said first boosting circuit comprises
a first boosting capacitor to be charged with a voltage applied from a power supply, and
a first switch connected with said first boosting capacitor to supply an output from said first boosting circuit to said second boosting circuit, and
said second boosting circuit comprises a second boosting capacitor to be charged with a voltage applied through said first switch.

3. The apparatus according to claim 2, wherein said control circuit supplies inphase driving signals to said first and second boosting capacitors and supplies a control signal to always keep said first switch ON when said boosting mode signal indicates said first mode, and supplies driving signals with opposite phases to said first and second boosting capacitors when said boosting mode signal indicates said second mode.

4. The apparatus according to claim 1, wherein
said first boosting circuit comprises
a first capacitor having one terminal connected to a power supply for applying a power supply voltage and the other terminal connected to said control circuit, and
a first switch connected in series between said one terminal of said first capacitor and said second boosting circuit, and
said second boosting circuit comprises a second capacitor having one terminal connected to said first switch and the other terminal connected to said control circuit.

5. The apparatus according to claim 1, wherein said selection circuit includes a program element.

6. The apparatus according to claim 1, wherein said selection circuit comprises fuses serving as program elements for respectively selecting the first and second modes.

7. A boosting apparatus for boosting a power supply voltage and outputting a boost voltage, said apparatus comprising:

cascade-connected boosting circuits a selection circuit for outputting a boosting mode signal; and a control circuit for controlling said boosting circuits in accordance with said boosting mode signal, wherein each of said cascade-connected boosting circuits comprises a boosting capacitor to be charged with a voltage applied from a power supply or the boosting circuit of a preceding stage, and a switch connected with said boosting capacitor to supply an output of said boosting circuit, wherein said control circuit controls all of said boosting circuits at the same phase to boost power supply voltages by a one stage boosting when said boosting mode signal indicates a first mode, and controls said boosting circuits at different phases in series to boost power supply voltages by multi-stage boosting when said boosting mode signal indicates a second mode.

8. The apparatus according to claim 7, wherein, when said boosting mode signal indicates said first mode, said control circuit supplies in-phase driving signals to said boosting capacitors of said cascade-connected boosting circuits, respectively, and supplies a control signal so that the switch of each said cascade-connected boosting circuits except for a boosting circuit connected with the last stage circuit is always kept ON.

9. The apparatus according to claim 7, wherein
each of said boosting circuits comprises a capacitor having one terminal connected to a power supply for applying a power supply voltage or the boosting circuit of the preceding stage, and the other terminal connected to said control circuit, and
a switch connected in series between said one terminal of said capacitor and the boosting circuit of the subsequent stage.

10. A boosting apparatus for boosting a power supply voltage and outputting the voltage, comprising:

first and second boosting sections each including cascade-connected boosting circuits;

a selection circuit for outputting a boosting mode signal; and a control circuit for controlling said first and second boosting sections and said boosting circuits therein in accordance with said boosting mode signal, wherein said control circuit performs control to said first and second boosting sections at different phases to alternately output voltages respectively boosted by said first and second boost selections from said first and second boosting sections, and controls all boosting circuits in said boosting sections to boost voltages at the same phase when said boosting mode signal indicates a first mode.

11. The apparatus according to claim 10, wherein
each of said first and second boosting sections comprises first and second boosting circuits, and
said control circuit controls said first and second boosting circuits to boost voltages at the same phase when said boosting mode signal indicates said first mode, and controls said first and second boosting circuits to boost voltages at different phase when said boosting mode signal indicates a second mode.

12. A boosting method using a boosting apparatus including cascade-connected first and second boosting circuits, said method comprising the step of a first and second boosting circuits are controlled to boost power supply voltages at the same phase when twofold boosting is designated by said boosting mode signal, and controlled to boost power supply voltages at different phases when threefolds boosting is designated by said boosting mode signal.

* * * * *